(12) United States Patent
Koganezawa et al.

(10) Patent No.: US 6,741,012 B2
(45) Date of Patent: May 25, 2004

(54) PIEZOELECTRIC ACTUATOR

(75) Inventors: Shinji Koganezawa, Kawasaki (JP); Kenichi Makino, Kawasaki (JP); Shuichi Heya, Kawasaki (JP); Shinji Hiraoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/025,018

(22) Filed: Dec. 19, 2001

(65) Prior Publication Data

US 2002/0043894 A1 Apr. 18, 2002

(30) Foreign Application Priority Data

Aug. 10, 2001 (JP) .......................................... 2001-243533

(51) Int. Cl.$^7$ ............................................... H01L 41/08
(52) U.S. Cl. ......................................................... 310/328
(58) Field of Search ........................... 310/328, 330–332

(56) References Cited

U.S. PATENT DOCUMENTS 5,714,833 A * 2/1998 Zumeris ...................... 310/328
6,307,301 B1 * 10/2001 Ngo et al. ................... 310/328
6,362,542 B1 * 3/2002 Novotny ....................... 310/12

* cited by examiner

Primary Examiner—Mark Budd
(74) Attorney, Agent, or Firm—Greer, Burns & Crain, Ltd.

(57) ABSTRACT

The small and light piezoelectric actuator of the present invention is capable of highly precisely positioning a magnetic head assemblies, etc. The piezoelectric actuator comprises: a movable member to which a head suspension is fixed; a fixed member fixed to a carriage arm; piezoelectric elements provided between the movable member and the fixed member and capable of adjusting a position of the head suspension by their deformation; and an electrode member electrically connected to one of electrodes of each of the piezoelectric elements. The movable member is adhered on the piezoelectric elements and electrically insulated from the other electrodes of the piezoelectric elements. The electric conductive layer of the electrode member and the other electrode of each of the piezoelectric elements are electrically connected to cables, which are provided to the head suspension so as to actuate the piezoelectric elements.

17 Claims, 7 Drawing Sheets

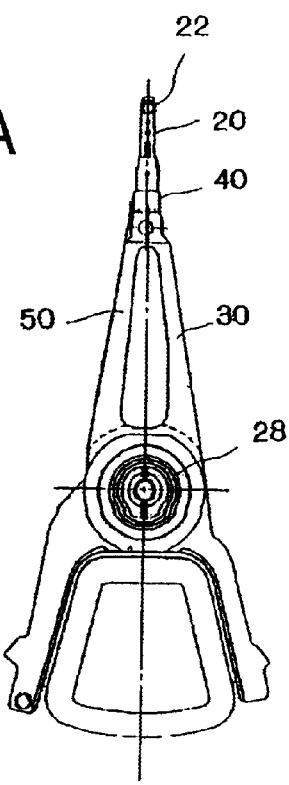
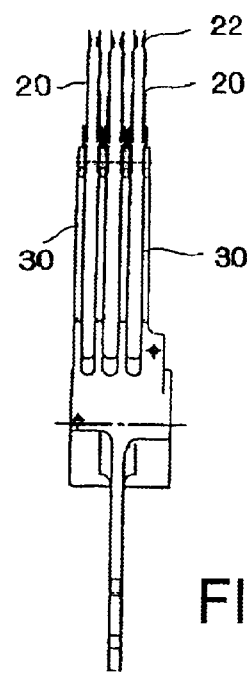
FIG.1A
FIG.1B
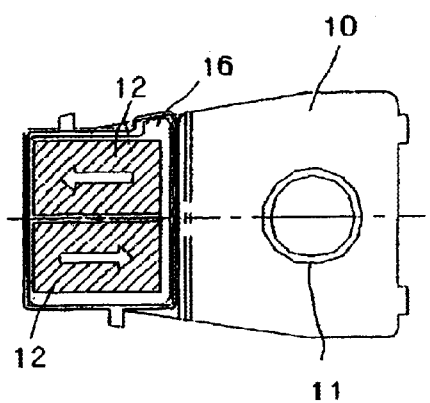
FIG.2A
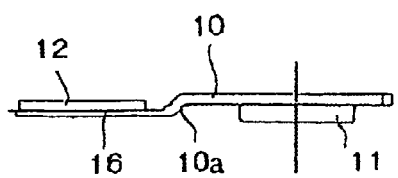
FIG.2B

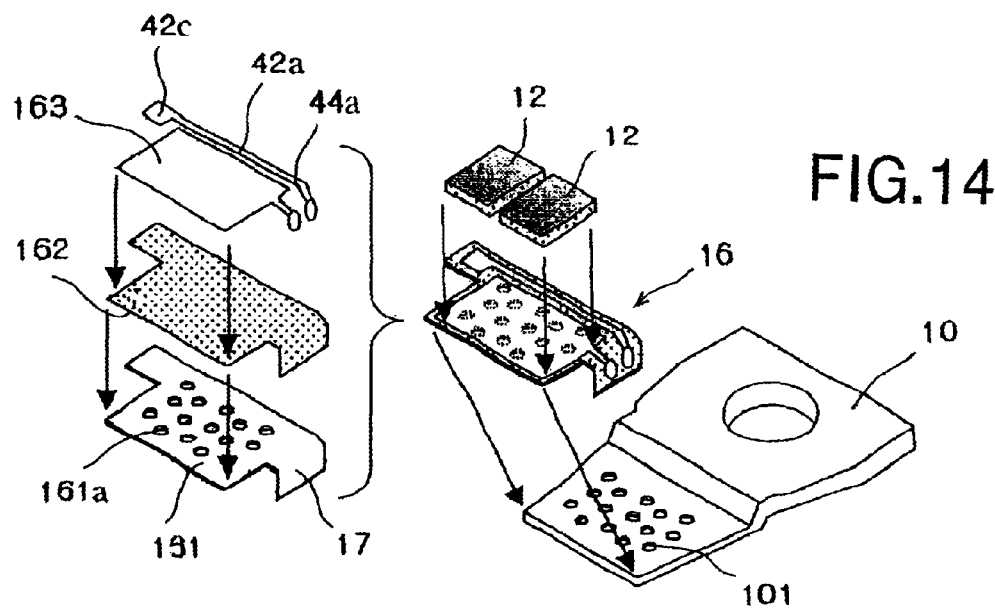
FIG.14
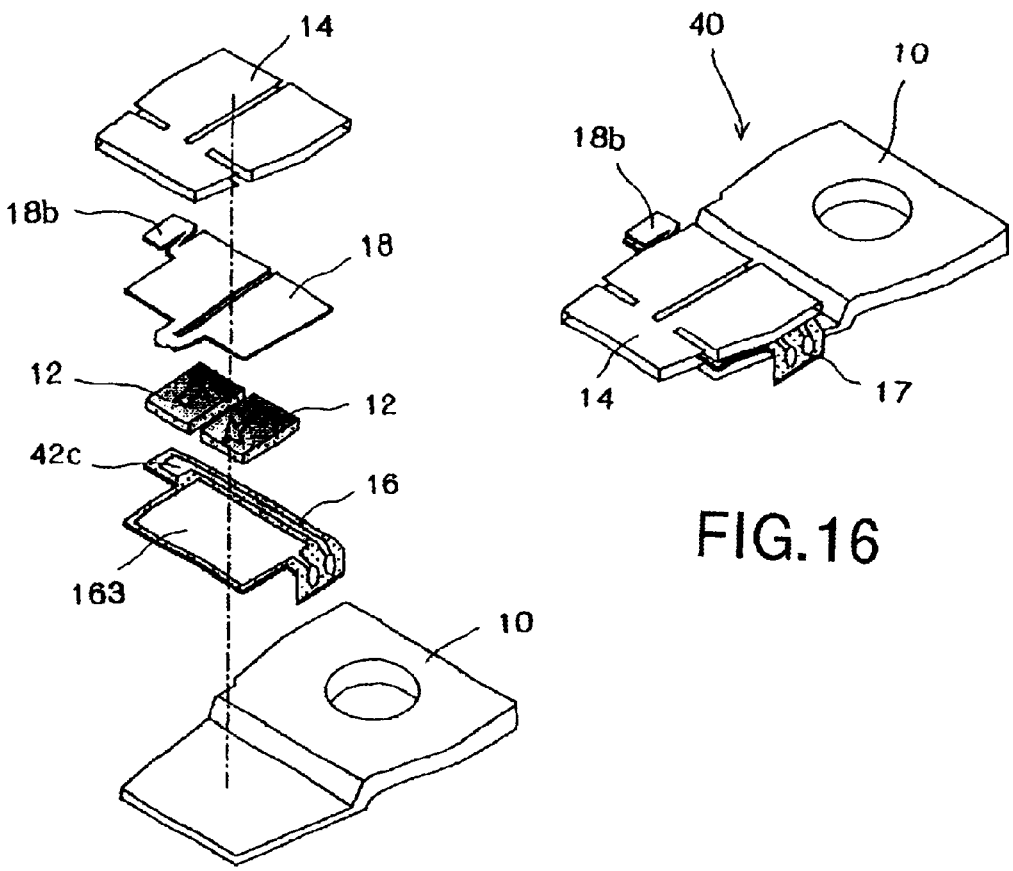
FIG.15
FIG.16

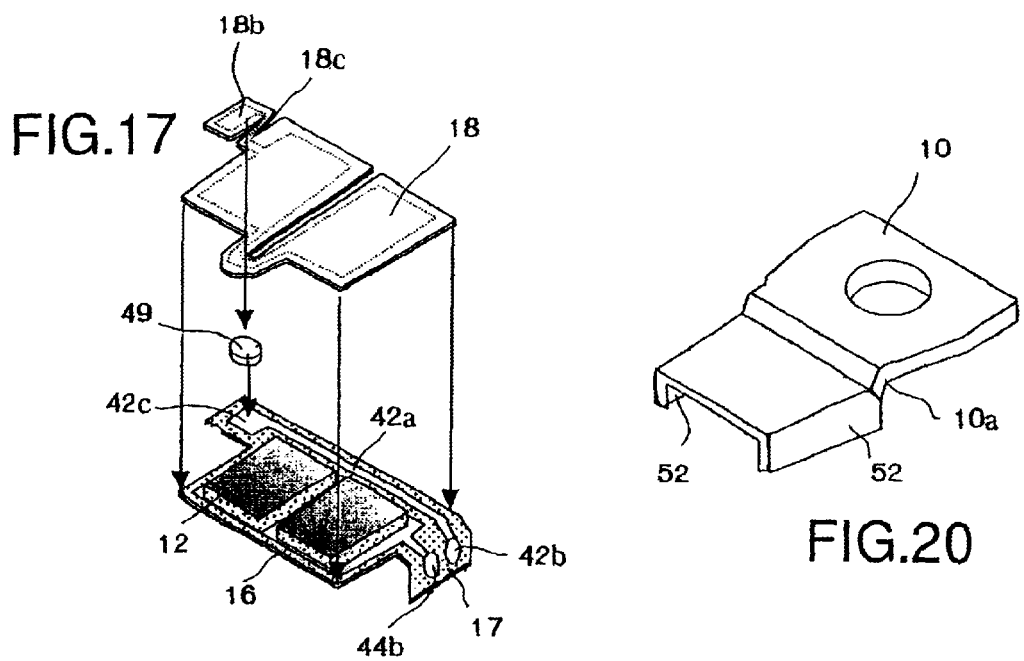
FIG. 17
FIG. 20
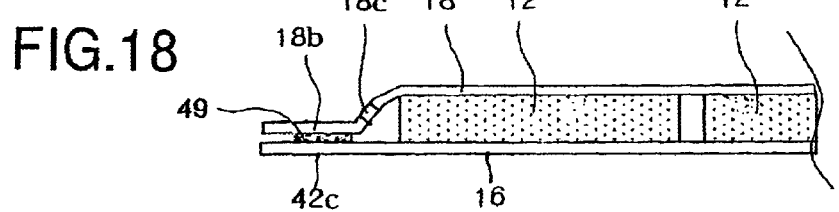
FIG. 18
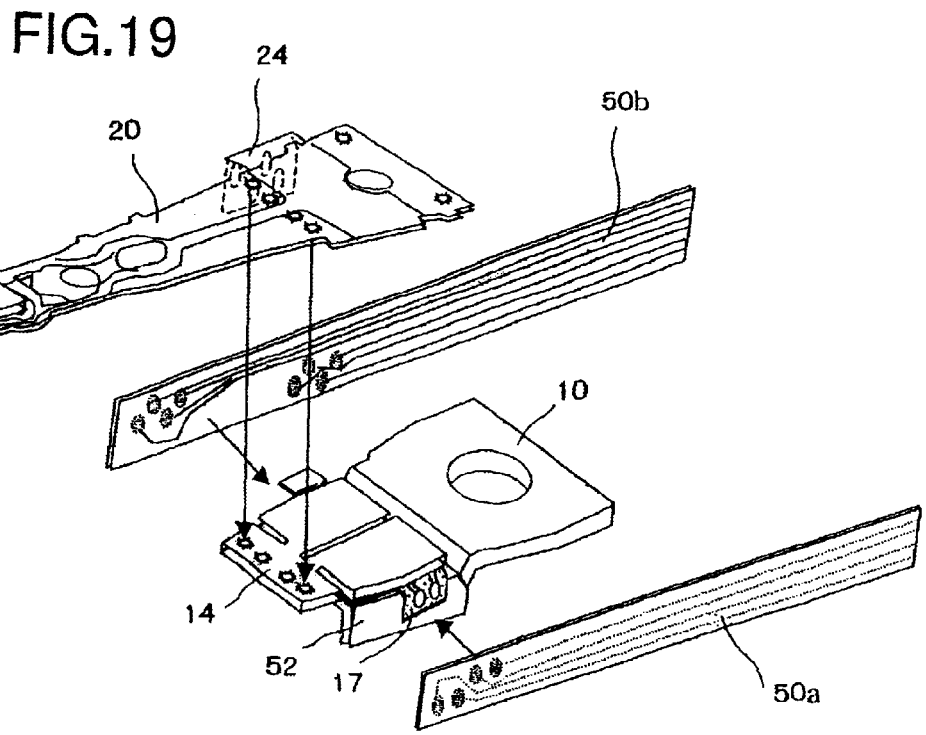
FIG. 19

PIEZOELECTRIC ACTUATOR

BACKGROUND OF THE INVENTION

The present invention relates to a piezoelectric actuator, more precisely relates to a piezoelectric actuator capable of precisely positioning a magnetic head.

These days, capacity of magnetic disk units are made greater but size of them are made smaller. Therefore, memory density of magnetic disks are made greater. To make the memory density greater, number of tracks in a unit length (TPI) must be made greater. Namely, width of each track must be made narrower. To correctly read data from and write data in the narrow tracks, a magnetic head must be highly precisely positioned.

To precisely position the magnetic head, the inventors of the present invention tried to actuate an actuator arm by a head actuating mechanism, further they tried to slightly move the magnetic head or a head suspension so as to correctly position the magnetic head or the head suspension. The inventors found that deformation of piezoelectric elements and a specific structure of a carriage arm are capable of moving the head suspension and precisely positioning the magnetic head. The piezoelectric actuator of the present invention employs the deformation of the piezoelectric elements.

An exploded perspective view of a conventional piezoelectric actuator, which employs the deformation of the piezoelectric elements, is shown in FIG. 21. The piezoelectric actuator has a flat actuator base 10, which is connected to a carriage arm, and a hinge plate 14, which sandwich the piezoelectric elements 12 with the actuator base 10. A first electrode member 16 is provided between the actuator base 10 and the piezoelectric elements 12; a second electrode member 18 is provided between the piezoelectric elements 12 and the hinge plate 14. The electrode members 16 and 18 input electric voltage to the piezoelectric elements 12 so as to apply shear stress to the piezoelectric elements 12 and deform them.

The electrode members 16 and 18 input electric voltage to the piezoelectric elements 12 sandwiched between the actuator base 10 and the hinge plate 14, so the actuator base 10 and the first electrode member 16 are electrically insulated each other, and the hinge plate 14 and the second electrode member 18 are also electrically insulated each other. One side face of the first electrode member 16, which contacts the actuator base 10, is covered with an insulating layer; the other side face of the first electrode member 16, which contacts the piezoelectric elements 12, is covered with an electric conductive layer. One side face of the second electrode member 18, which contacts the hinge plate 14, is covered with an insulating layer; the other side face of the second electrode member 18, which contacts the piezoelectric elements 12, is covered with an electric conductive layer.

A plan view of a magnetic head assembly, to which the piezoelectric actuator shown in FIG. 22 is assembled, is shown in FIG. 21. The head suspension 20 is connected to the hinge plate 14. The deformation of the piezoelectric elements 12 move the hinge plate 14, in a plane, in the right-left directions, so that the head suspension 20 is also moved in the right-left directions and the magnetic head, which is mounted on the head suspension 20, can be correctly positioned. Side edges of the electrode members 16 and 18 are bent, and terminals 16a and 18a, which will be connected to a flexible printed circuit, are formed therein.

As shown in FIG. 22, in the magnetic head assembly including the conventional piezoelectric actuator, a terminal section 24, to which cables connecting to the magnetic head will be connected, is formed at one side edge of the head suspension 20; terminals 16a and 18a for actuating the piezoelectric elements 12 are formed at the other side edge thereof. With this structure, a flexible printed circuit, which will be connected to the terminal section 24 of the suspension 20, and another flexible printed circuit, which will be connected to the terminals 16a and 18a, must be required. Namely, manufacturing cost of the head assembly must be high. In the case that the terminal section 24 and the terminals 16a and 18a are provided on the same side of the head suspension 20 and one flexible printed circuit is connected thereto, positions of the terminal section 24 and the terminals 16a and 18a must be highly precisely located. If the are slightly shifted from the predetermined positions and a step-shaped section is formed between the terminal section 24 and the terminals 16a and 18a, it is very difficult to correctly connect the flexible printed circuit to the terminal section 24 and the terminals 16a and 18a, so that manufacturing cost of the head assembly must be higher.

In the conventional piezoelectric actuator shown in FIG. 21, the actuator base 10 and the hinge plate 14 are electrically insulated from the piezoelectric elements 12, and the electrode members 16 and 18 are provided between the actuator base 10 and the hinge plate 14 so as to input voltage to the piezoelectric elements 12. As described above, size of magnetic disk units are made smaller, so the piezoelectric actuator must be smaller and lighter. Mechanical characteristics of the piezoelectric actuator depends on its mass. If mass of the piezoelectric actuator is great, the carriage arm vibrates and badly influences the characteristics. Further, number of parts of the piezoelectric actuator must be reduced so as to reduce the manufacturing cost.

SUMMARY OF THE INVENTION

The present invention was invented to solve the disadvantages of the conventional piezoelectric actuator.

An object of the present invention is to provide a small and light piezoelectric actuator, which is capable of highly precisely positioning magnetic head assemblies, reducing number of parts and manufacturing cost, and improving characteristics.

To achieve the object, the present invention has following structures.

A first basic structure of the piezoelectric actuator of the present invention comprises: a movable member to which a head suspension is fixed; a fixed member being fixed to a carriage arm; a plurality of piezoelectric elements being provided between the movable member and the fixed member, the piezoelectric elements being capable of adjusting a position of the head suspension by their deformation; and an electrode member being provided to a part of the fixed member on which the piezoelectric elements are provided, the electrode member having an electric conductive layer, which is electrically insulated from the fixed member and electrically connected to one of electrodes of each of the piezoelectric elements, wherein the movable member is adhered on the piezoelectric elements and electrically insulated from the other electrodes of the piezoelectric elements, and the electric conductive layer of the electrode member and the other electrode of each of the piezoelectric elements are electrically connected to cables, which are provided to the head suspension so as to actuate the piezoelectric elements.

A second basic structure of the piezoelectric actuator comprises: a movable member to which a head suspension is fixed; a fixed member being fixed to a carriage arm; and a plurality of piezoelectric elements being provided between the movable member and the fixed member, the piezoelectric elements being capable of adjusting a position of the head suspension by their deformation, wherein the piezoelectric elements are fixed to the fixed member, and one of electrodes of each of the piezoelectric elements is electrically connected to the fixed member, the movable member is adhered on the piezoelectric elements and electrically insulated from the other electrodes of the piezoelectric elements, and the other electrode of each of the piezoelectric elements is electrically connected to a cable, which is provided to the head suspension so as to actuate the piezoelectric elements.

A third basic structure of the piezoelectric actuator comprises: a movable member to which a head suspension is fixed; a fixed member being fixed to a carriage arm; a plurality of piezoelectric elements being provided between the movable member and the fixed member, the piezoelectric elements being capable of adjusting a position of the head suspension by their deformation; and an electrode member being provided to a part of the fixed member on which the piezoelectric elements are provided, the electrode member having a pair of cable patterns, which are electrically insulated from the fixed member and electrically connected to electrodes of each of the piezoelectric elements so as to actuate the piezoelectric elements, and being extended so as to connect a flexible printed circuit thereto; wherein the piezoelectric elements are fixed to the electrode member, and one of the cable patterns is electrically connected to one of the electrodes of each of the piezoelectric elements, the movable member is adhered on the piezoelectric elements, and the movable member is electrically insulated from the other electrode of each of the piezoelectric elements, and the other cable pattern is electrically connected to the other electrode of each of the piezoelectric elements.

A fourth basic structure of the piezoelectric actuator comprises: a movable member to which a head suspension is fixed; a fixed member being fixed to a carriage arm; a plurality of piezoelectric elements being provided between the movable member and the fixed member, the piezoelectric elements being capable of adjusting a position of the head suspension by their deformation; a first electrode member being provided between the fixed member and the piezoelectric elements; and a second electrode member being provided between the movable member and the piezoelectric elements, wherein the first electrode member includes a pair of cable patterns, which are electrically connected to electrodes of each of the piezoelectric elements, and terminals, which are formed in a side edge of the fixed member and can be connected to a flexible printed circuit, and the second electrode includes a terminal, which is electrically connected to one of the cable patterns connected to one of the electrodes of each of the piezoelectric elements when the piezoelectric elements are sandwiched between the first electrode member and the second electrode member.

In the piezoelectric actuator of the present invention, the electrode member is provided between the fixed member and the piezoelectric elements or directly fixed to the fixed member, so number of the parts of the piezoelectric actuator can be reduced. By reducing the number of the parts, the piezoelectric actuator can be smaller in size and manufacturing cost can be reduced. If the terminal section includes the terminals of the cables for actuating the piezoelectric elements, a circuit connected to the piezoelectric actuator and the head suspension can be electrically connected by one flexible printed circuit, so that the structure of the piezoelectric actuator can be simple, the flexible printed circuit can be easily connected and the manufacturing cost can be further reduced.

BRIEF DESCRIPTION OF THE DRAWINGS

Embodiments of the present invention will now be described by way of examples and with reference to the accompanying drawings, in which:

FIG. 1A is a plan view of magnetic head assemblies attached to carriage arms;

FIG. 1B is a side view of the magnetic head assemblies attached to the carriage arms;

FIG. 2A is a plan view of piezoelectric elements attached to an actuator base;

FIG. 2B is a side view of the piezoelectric elements attached to the actuator base;

FIG. 14 is an exploded perspective view of another piezoelectric actuator;

FIG. 15 is an exploded perspective view of a piezoelectric actuator having a second electrode member including terminals;

FIG. 16 is a perspective view of the assembled piezoelectric actuator shown in FIG. 15;

FIG. 17 is an enlarged perspective view of a first electrode member and the second electrode member;

FIG. 18 is a sectional view showing a state in which the first electrode member and the second electrode member are fixed;

FIG. 19 is an exploded perspective view of an actuator base having backup sections to which flexible printed circuit are connected;

FIG. 20 is a perspective view of the actuator base having the backup sections;

DETAILED DESCRIPTION OF THE PREFERRED EMBODIMENTS

Figure 3A:
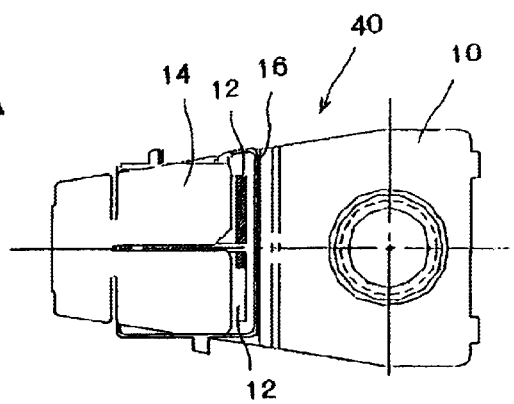
FIG. 3A is a plan view of a hinge plate attached to the piezoelectric elements.

Preferred embodiments of the present invention will now be described in detail with reference to the accompanying drawings.

FIGS. 1A–1B show a structure of head assemblies including the piezoelectric actuators of the present invention. A plurality of carriage arms 30 are attached to a supporting shaft 28 and arranged in an axial direction of the shaft 28 with regular separations. In each of the magnetic head assemblies, the piezoelectric actuator 40 is fixed to a front end of the carriage arm 30 by caulking.

A flexible printed circuit 50 is provided along side faces of the carriage arms 30. In the present embodiment, terminal sections of the head suspensions 20 and terminals of the piezoelectric actuators 40 are provided on the same side of the head assemblies. Namely, they are connected to the flexible printed circuit 50 on one side of the head assembly.

Figure 3B:
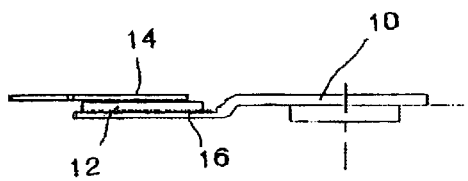
FIG. 3B is a side view of the hinge plate attached to the piezoelectric elements.
Figure 21:
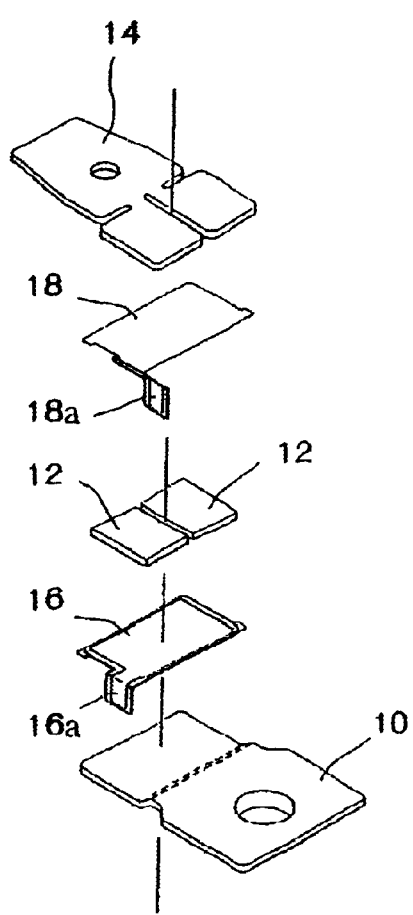
FIG. 21 is the exploded perspective view of the conventional piezoelectric actuator.
Figure 22:
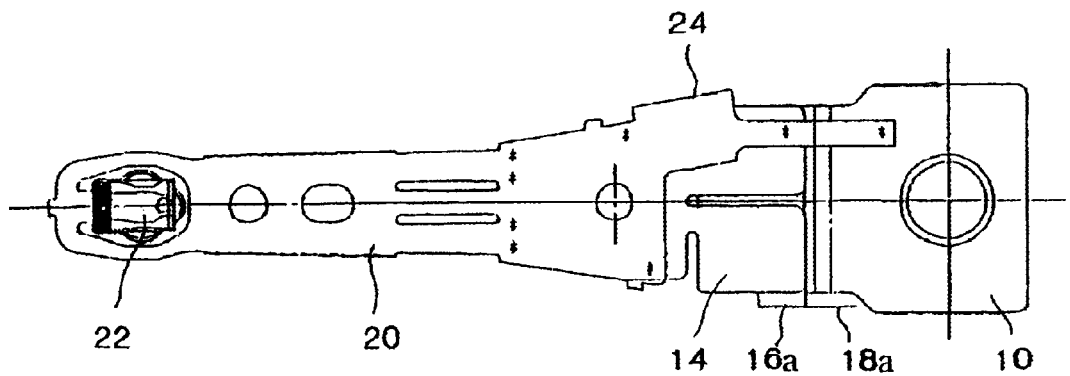
FIG. 22 is the plan view of the conventional magnetic head assembly.

Details of the piezoelectric actuator 40 is shown in FIGS. 2A–3B. FIG. 2A is a plan view showing a state, in which the piezoelectric elements 12 are attached to an actuator base 10, which acts as a fixed member, with a first electrode member 16; FIG. 2B is a side view of the same state. FIG. 3A is a plan view showing a state, in which a hinge plate 14, which acts as a movable member, is further provided on the piezoelectric elements 12 shown in FIGS. 2A and 2B; FIG. 3B is a side view of the same state. As shown in FIGS. 2A–3B, the piezoelectric actuator 40 of the present embodiment includes: the actuator base 10; the first electrode member 16; the piezoelectric elements 12; and the hinge plate 14. Unlike the conventional piezoelectric actuator, the piezoelectric actuator 40 has no second electrode member 18 (see FIG. 21). Namely, in the piezoelectric actuator 40, only the first electrode 16 is provided between the actuator base 10 and the piezoelectric elements 12.

The carriage arm 30 is fixed on a bottom face of a base portion of the actuator base 10 by caulking. A positioning hole 11 is formed in the actuator base 10 so as to position the carriage arm 30 with respect to the actuator base 10 when the carriage arm 30 is caulked and fixed to the actuator base 10.

As shown in FIG. 2B, a step section 10a is formed at a mid portion of the actuator base 10. With this structure, level of a front portion of the actuator base 10, on which the piezoelectric elements 12 are mounted, is lower than that of the base portion thereof, which is fixed to the carriage arm 30. By forming the step section 10a with considering thickness of the piezoelectric elements 12 and the hinge plate 14, level of the head suspension 20 and level of the base portion of the actuator base 10 can be almost equal when the head suspension 20 is attached to the piezoelectric actuator 40.

In the present embodiment, thickness of the base portion of the actuator base 10, which is fixed to the carriage arm 30, is 0.2 mm; height of the step section 10a is 0.1–0.12 mm; thickness of the front portion of the actuator base 10, on which the piezoelectric elements 12 are mounted, is 0.1–0.15 mm. By forming the step section 10a, a clearance between the carriage arm 30 and a surface of a recording medium can be almost equal to that of the conventional disk drive unit. Since the thickness of the base portion of the actuator base 10, on which the piezoelectric elements 12 are mounted, is a half of the thickness of other portions of thereof, the level of the head suspension 20 can be almost equal to that of the base portion of the actuator base 10.

As described above, the piezoelectric elements 12 are mounted on the actuator base 10 with the first electrode member 16. Electric potential of the carriage arm 30 is usually the earth potential, so the piezoelectric elements 12 must be electrically insulated from the actuator base 10, whose electric potential is also the earth potential. In the present embodiment, the first electrode member 16 comprises: a thin stainless steel layer, which contacts the actuator base 10; an insulating layer, which is formed on the thin stainless steel layer and made of an insulating material, e.g., polyimide; and a copper layer, which is formed on the insulating layer. By employing the first electrode member 16, the piezoelectric elements 12 can be attached to and insulated from the actuator base 10. The first electrode member 16 can be made very thinner by a known film forming technique. In the present embodiment, thickness of the first electrode member is 10–20 μm.

As shown in FIG. 2A, the first electrode member 16 is broader than the piezoelectric elements 12. Namely, the first electrode member 16 is slightly extended outward from edges of the piezoelectric elements 12. Gold layers are formed on upper faces and lower faces of the piezoelectric elements 12 as electrodes. In the present embodiment, thickness of the gold electrodes are about 0.4 μm. Since the electrodes of the piezoelectric elements 12 are connected to cables by a proper manner, e.g., wire bonding, preferred thickness of the electrodes are 0.2 μm or more. By mounting the piezoelectric elements 12 on the first electrode member 16, the piezoelectric elements 12 can be electrically connected to the first electrode member 16. Note that, in FIG. 2A, arrows show polarizing directions of the piezoelectric elements 12 or directions of the shear stress in the piezoelectric elements 12. Since the piezoelectric elements 12, whose polarizing directions are mutually different, are mounted and fixed to the first electrode member 16, the head suspension 20 can be moved or turned, in a plane, in the right-left directions by the piezoelectric-deformation of the piezoelectric elements 12.

When the hinge plate 14 is attached to the piezoelectric elements 12 as shown in FIG. 3A, a part of the gold electrode of each piezoelectric element 12 is extended from a rear end of the hinge plate 14. With this arrangement, a part of the copper layer of the first electrode member 16 is also exposed. Since the gold electrodes of the piezoelectric elements 12 and the copper layer of the first electrode member 16 are partially exposed, the gold electrodes of the piezoelectric elements 12 can be electrically connected, by wire bonding, in the following step.

When the hinge plate 14 is attached on the upper faces of the piezoelectric elements 12, the hinge plate 14 must be electrically insulated from the piezoelectric elements 12. With this structure, cables for processing signals, which will be provided to the head suspension 20 and connected to the hinge plate 14, and cables for actuating the piezoelectric elements 12, which acts as the ground lines, are mutually insulated, so that no noises interface signals for reading and writing. In the present embodiment, the hinge plate 14 is insulated from and adhered on the piezoelectric elements 12.

Figure 4:
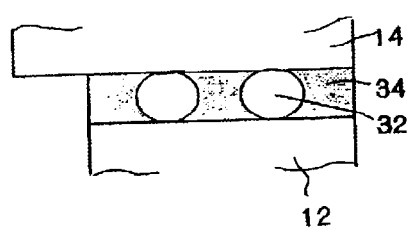
FIG. 4 is an explanation view showing a manner of adhering the hinge plate to the piezoelectric elements.

For example, the hinge plate 14 is adhered on the piezoelectric elements 12 by an adhesive 34 which includes insulating fillers 32, whose diameters are about 15 μm. FIG. 4 shows the state, in which the hinge plate 14 is adhered on the piezoelectric element 12 by the adhesive 34 including the insulating fillers 32. The hinge plate 14 can be securely separated from the piezoelectric element 12 by the insulating fillers 32, so that the hinge plate 14 and the piezoelectric element 12 are electrically insulated and adhered each other. If the insulating fillers 32 are made of a soft material, damage and break of the piezoelectric elements 12, which are occurred when the hinge plate 14 is pressed onto the piezoelectric elements 12 so as to adhere, can be prevented.

Figure 5:
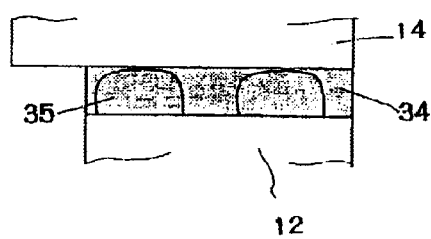
FIG. 5 is an explanation view showing another manner of adhering the hinge plate to the piezoelectric elements.

Other manners for adhering the hinge plate 14 onto the piezoelectric elements 12 will be explained with reference to FIGS. 5–7. In FIG. 5, projected sections 35, which are made of an insulating material, are previously formed in the surface of the piezoelectric elements 12, and the hinge plate 14 is adhered onto the piezoelectric elements 12 by an adhesive 34.

Figure 6:
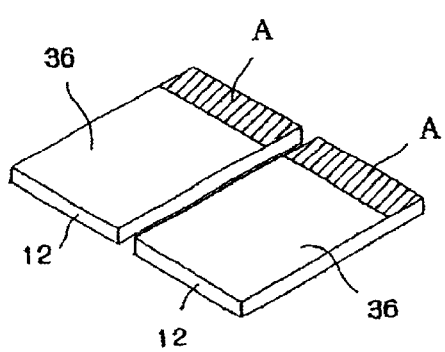
FIG. 6 is a perspective view of the piezoelectric elements covered with resin layers.

In FIG. 6, all faces of the piezoelectric elements 12 are coated with resin layers 36, but parts "A" of the upper faces, which are indicated by slant lines, are not coated. By coating with the resin layers 36 except parts "A", parts of the upper faces of the piezoelectric elements 12, on which the hinge plate 14 is adhered, can be electrically insulated by the resin layers 35.

Figure 7:
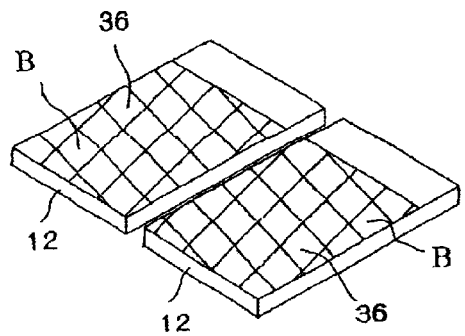
FIG. 7 is a perspective view of another example of the piezoelectric elements covered with resin layers.

In FIG. 7, only parts "B" of the upper faces of the piezoelectric elements 12, which are indicated by slant lines crossing and on which the hinge plate 14 is adhered, are coated with resin layers 36 so as to electrically insulate. The resin layers 35 may be formed by the steps of: masking a part of an aggregating body of the piezoelectric elements, in which a plurality of piezoelectric elements are arranged; coating an upper face of the aggregating body with the resin; and cutting the aggregating body to form the piezoelectric elements.

As shown in FIGS. 6 and 7, the parts of the piezoelectric elements 12, on which the hinge plate 14 is adhered, are coated with the resin layers 36, so that the hinge plate 14 can be securely insulated from and adhered on the piezoelectric elements 12. Even if the hinge plate 14 is pressed onto the piezoelectric elements 12, the hinge plate 14 can be adhered without damaging and breaking the piezoelectric elements 12. In comparison with the insulating fillers 32, thickness of the resin layers 36 can be precisely controlled, so assembling accuracy can be made higher. Note that, if the hinge plate 14 can be securely insulated from and adhered onto the piezoelectric elements 12, the insulating fillers 32 and the resin layers 36 can be omitted.

Figure 9:
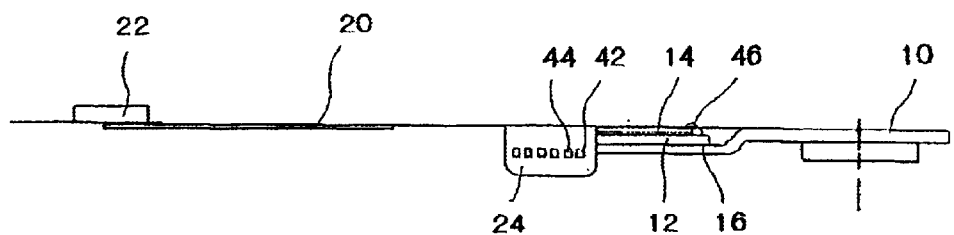
FIG. 9 is a side view of the magnetic head assembly.
Figure 10A:
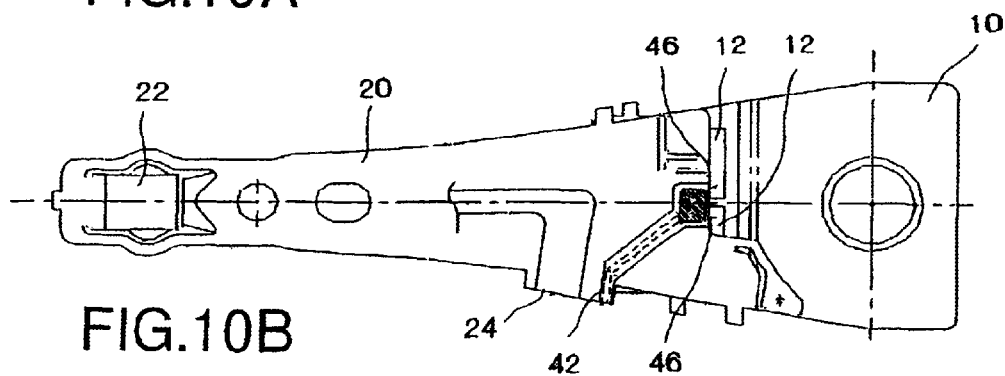
FIG. 10A is a plan view of another example of a magnetic head assembly.
Figure 10B:
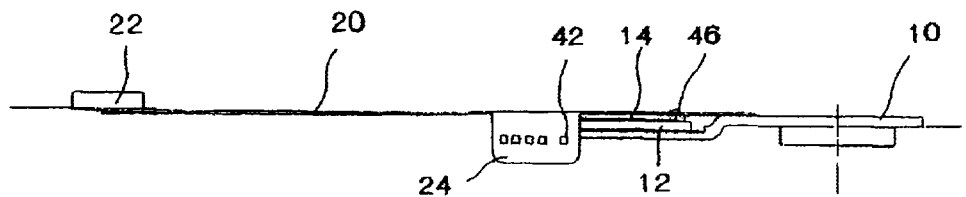
FIG. 10B is a side view of the example shown in FIG. 10A.

FIG. 9 is a side view of the magnetic head assembly, in which the piezoelectric actuator 40 is attached to the head suspension 20; FIG. 10A is a plan view of another magnetic head assembly; FIG. 10B is a side view thereof. The head suspension is fixed to the hinge plate 14 by spot welding. In the present embodiment, a pair of cables 42 and 44 for actuating the piezoelectric elements 12 are formed on the head suspension 20. The cable 42 is connected to the piezoelectric elements 12 by wire bonding; the cable 44 is connected to the copper layer of the first electrode member 16 by wire bonding. Symbols 46 stand for bonding wires, which connect the cable 42 to the piezoelectric elements 12; a symbol 48 stands for a bonding wire, which connects the cable 44 to the first electrode member 16.

The parts of the piezoelectric elements 12 are extended from the rear end of the hinge plate 14, and the gold electrode layers are exposed in the piezoelectric elements 12, so that the cable 42 and the gold electrodes can be easily connected by wire bonding. The cable 44 and the first electrode member 16 can be easily electrically connected by wire bonding to the copper layer of the first electrode member 16, which is extended from the piezoelectric elements 12. Since the copper layer of the first electrode member 16 is connected to the both piezoelectric elements 12, the cable 44 can be connected to the first electrode member 16 by one bonding wire 48. In the present embodiment, the bonding wires 46 and 48 are coated with resin, so that the bonding wires 46 and 48 are not damaged even if they are vibrated by air stream in the disk drive unit.

Figure 8:
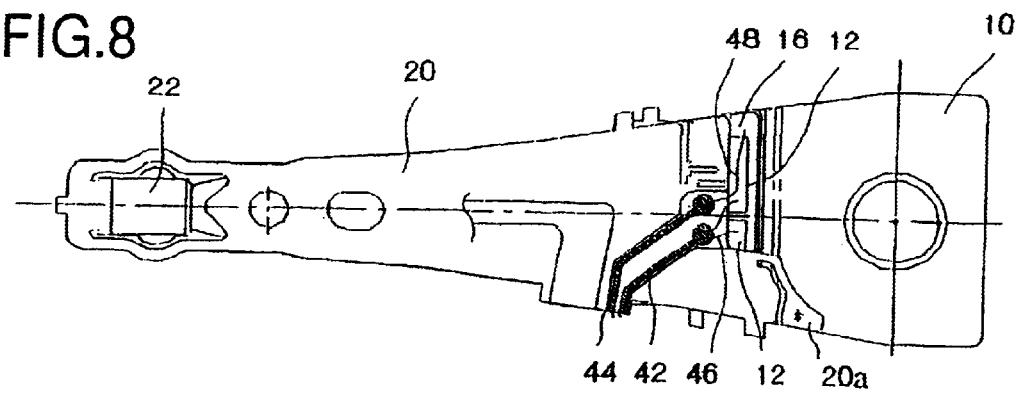
FIG. 8 is a plan view of the magnetic head assembly.

Signal lines, which are connected to a slider 22, are formed on the head suspension 20 and extended to a terminal section 24, which is formed by bending a side edge of the head suspension 20. As shown in FIGS. 8 and 9, the cables 42 and 44 for actuating the piezoelectric elements 12 are also extended to the terminal section 24 of the head suspension 20, so that their terminals and the terminals of the signal lines are located in the terminal section 24. With this structure, the piezoelectric actuator 40 can be connected to an electric source via one flexible printed circuit, which is connected to the signal lines of the head suspension 20. Since the terminals of the cables 42 and 44 and the signal lines are provided in the terminal section 24, two flexible printed circuit, to which the cables and the signal lines are separately connected, are not required. Therefore, the one flexible printed circuit can be easily connected, assembling efficiency can be improved, and manufacturing cost can be reduced. Further, the terminals are provided in the same terminal section 24, the flexible printed circuit can be securely connected to the terminals.

In FIG. 8, an extended section 20a is formed by partially extending a rear end of the head suspension 20 until reaching the actuator base 10. The extended section 20a is fixed to the actuator base 10 by spot welding. By welding the extended section 20a to the actuator base 10, the head suspension 20 and the actuator base 10 are electrically connected, so that electric potential of the head suspension 20 can be the earth potential. Despite the head suspension 20 is fixed to the actuator base 10 by spot welding, the head suspension 20 can be deformed due to a slit formed in the extended section 20a. Preferably, the slit is formed near the welding point, at which the head suspension 20 is fixed to the actuator base 10 by spot welding.

Another magnetic head assembly is shown in FIGS. 10A and 10B. The magnetic head assembly is characterized by no first electrode member 16. In the above described embodiment, the actuator base 10 and the piezoelectric elements 12 are electrically insulated by the first electrode member 16. In the present embodiment, the piezoelectric elements 12 are directly mounted on the actuator base 10, so that electric potential of the one electrode of each piezoelectric element 12 is the earth potential. In this case, only the cable 42, which inputs voltage to the piezoelectric elements 12, may be provided to the head suspension 20. In FIG. 10A, a pad section of the cable 42, which is formed at an end thereof, is electrically connected to the piezoelectric elements 12 by wire bonding. Another end of the cable 42 is extended to the terminal section 24 of the head suspension 20 as well as the former embodiment.

In the present embodiment, the first electrode member 16 is omitted, so number of the parts can be further reduced. And, the piezoelectric actuator can be thinner.

Further, another embodiment is shown in FIGS. 11A–13B. In the present embodiment, the cable patterns 42a and 44a for actuating the piezoelectric elements 12 are provided to the first electrode member 16, and the terminals 42b and 44b of the cable patterns 42 and 44 and the terminal section 24 of the head suspension 20 are formed on the same side. A terminal section 17 of the first electrode member 16 is formed by bending a side edge of the first electrode member 16, and the terminals 42b and 44b of the cable patterns 42a and 44a are located in the terminal section 17.

Figure 12A:
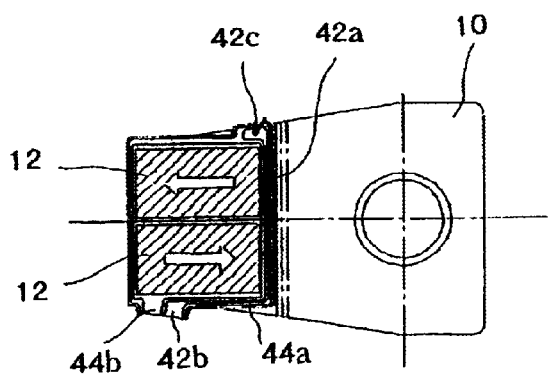
FIG. 12A is a plan view of the piezoelectric elements mounted on the actuator base.
Figure 12B:
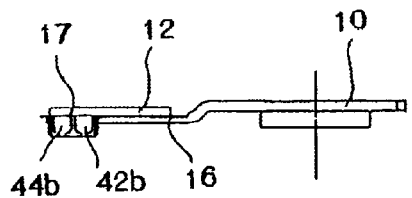
FIG. 12B is a side view of the piezoelectric elements mounted on the actuator base.

In FIGS. 12A and 12B, the first electrode member 16 is adhered to the actuator base 10, and the piezoelectric elements 12 are fixed to the first electrode member 16. The first electrode member 16 has three layers: the thin stainless steel layer; the insulating layer; and the copper layer as well as the former embodiment. The cable pattern 44a is connected to the copper layer of the first electrode member 16; the cable pattern 42a is connected to the gold electrodes of the piezoelectric elements 12, which are formed on the upper faces thereof. A pad section 42c for wire bonding is formed at one end of the cable pattern 42a, which is extended outward from the piezoelectric elements 12: the terminal 42b is formed at the other end of the cable pattern 42a. The cable patterns 42a and 44a can be easily formed by a known film forming technique.

Figure 13A:
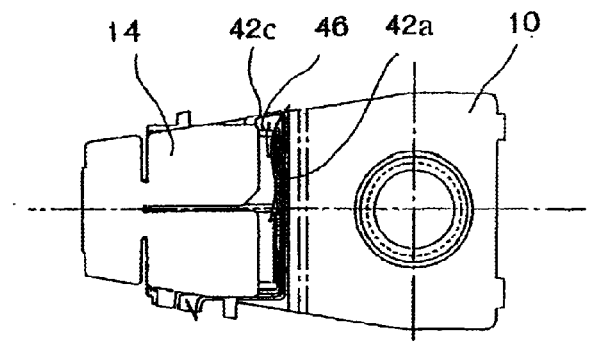
FIG. 13A is a plan view of the hinge plate adhere on the piezoelectric elements.
Figure 13B:
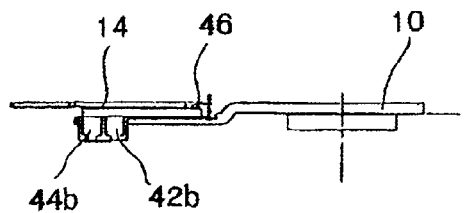
FIG. 13B is a side view of the hinge plate adhere on the piezoelectric elements.

In FIGS. 13A and 13B, the hinge plate 14 is fixed to the piezoelectric elements 12, and the piezoelectric elements 12 are connected to the cable pattern 42a by wire bonding. The hinge plate 14 is electrically insulated and adhered on the upper faces of the piezoelectric elements 12 as well as the former embodiment. Parts of the upper faces of the piezoelectric elements 12 are extended from a rear end of the hinge plate 14 and exposed. The piezoelectric elements 12 and the pad section 42c of the cable pattern 42a are electrically connected by wire bonding. The symbol 46 stands for the bonding wires. Since the upper faces of the piezoelectric elements 12 are coated with the gold layers, the adjacent piezoelectric elements 12 are connected by wire bonding, and the piezoelectric element 12 close to the pad section 42c is connected to the pad section 42c by wire bonding. With this structure, two piezoelectric elements 12 are electrically connected to the cable pattern 42a.

The gold layers on the bottom faces of the piezoelectric elements 12 are connected to the copper layer of the first electrode member 16 and electrically connected to the terminal 44b by the cable pattern 44a; the gold layers on the upper faces of the piezoelectric elements 12 are electrically connected to the terminal 42b by the bonding wires 46 and the cable pattern 42a.

Figure 11A:
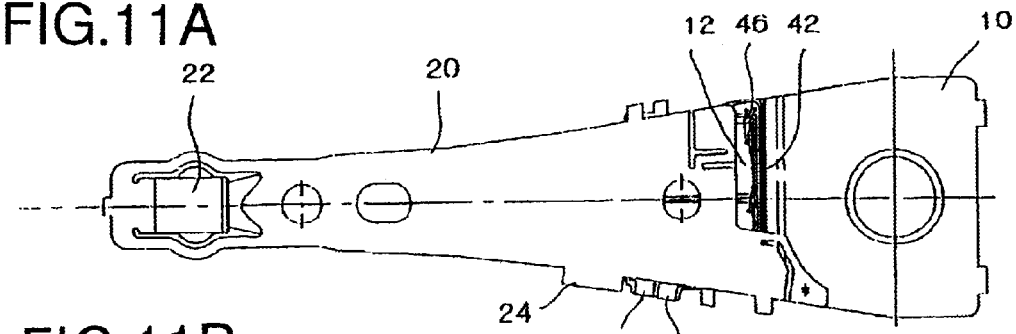
FIG. 11A is a plan view of other example of a magnetic head assembly.
Figure 11B:
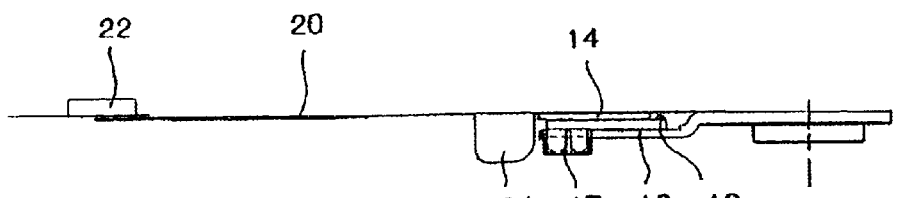
FIG. 11B is a side view of the example shown in FIG. 11A.

As shown in FIGS. 11A and 11B, the terminal section 24 and the terminals 42b and 44b for inputting voltage to the piezoelectric actuator 40 are formed on the same side, the electric source can be connected to the circuit for actuating the piezoelectric actuator 40 by the flexible printed circuit connected to the signal lines of the head suspension 20. Since the terminal sections 17 and 24 are corresponded, the flexible printed circuit can be easily connected to the terminal sections 17 and 24.

Another example of the first electrode member 16 is shown in FIG. 14. The cable patterns 42a and 44a are formed in the first electrode member 16. The first electrode member 16 comprises: a thin stainless steel layer 161; an insulating layer 162, which is made of an insulating material. e.g. polyimide; and a copper layer 163. The cable patterns 42a and 44a are formed by patterning the copper layer 163. In FIG. 14, a plurality of through-holes 161a are bored in the stainless steel layer 161, and fine projections 101 are formed in a part of the actuator base 10, on which the first electrode member 16 is adhered, by proper means, e.g., laser, so as to improve adhering strength between the first electrode member 16 and the actuator base 10. The through-holes 161a and the fine projections 101 make contact area of an adhesive broader, so that the adhering strength can be made greater.

Another embodiment of the piezoelectric actuator 40 will be explained with reference to FIGS. 15–18. In the present embodiment, the piezoelectric actuator 40 has the first electrode member 16 and the second electrode member 18. FIG. 15 is an exploded perspective view of the piezoelectric actuator 40; FIG. 16 is a perspective view of the assembled piezoelectric actuator 40. The characteristic point of the present embodiment is a terminal 18b, which is formed in the second electrode member 18 and which is electrically connected to the pad section 42c of the first electrode member 16. As shown in FIG. 15, the pad 42c is extended from the first electrode member 16; the terminal 18b is extended and corresponded to the pad section 42c.

FIG. 17 shows the first electrode member 16 and the second electrode member 18. The pad section 42c of the first electrode member 16 and the terminal 18b of the second electrode member 18 are electrically connected when the piezoelectric elements 12 are sandwiched between the electrode members 16 and 18. In the present embodiment, the pad section 42c and the terminal 18b are electrically connected by a connecting member 49, e.g., electric conductive resin, a solder ball, a gold bump.

FIG. 18 shows a state in which the first and second electrode members 16 and 18 and the piezoelectric elements 12 are piled. The terminal 18b is bent and connected to the pad section 42c by the connecting member 49. To securely connect the terminal 18b to the pad section 42c, a slit 18c is formed in the terminal 18b. By forming the slit 18c, the extended terminal 18b can be easily bent. Since the second electrode member 18 is made of a thin metal plate, the upper electrodes of the piezoelectric elements 12 can be electrically connected to the terminal 42b by the cable pattern 42a when the terminal 18b is connected to the pad section 42c.

After the second electrode member 18 is attached, the hinge plate 14 is electrically insulated from and adhered onto the second electrode member 18. The piezoelectric actuator 40 shown in FIG. 16 is completed by adhering the hinge plate 14.

In the above described embodiments, the terminals, which are connected to the circuit for driving the piezoelectric actuator 40, and the terminal section 24 of the head suspension 20 are located on the same side. In a magnetic head assembly shown in FIG. 19, the terminal section for reading and writing data is provided to one side of the head suspension 20; the terminals connected to the circuit for driving the piezoelectric actuator 40 are provided to the other side of the head suspension 20. The characteristic point of the present embodiment is backup sections 52, which are formed into L-shape by bending both side edges of the actuator base 10. A perspective view of the actuator base 10 having the backup sections 52 is shown in FIG. 20.

In FIG. 19, the first electrode member 16 is attached to the actuator base 10, and the terminal section 17 is held by an outer face of one of the backup sections 52. Since the head suspension 20 is attached to the hinge plate 14 by spot welding, the terminal section 24 of the head suspension 20 is held by an outer face of the other backup section 52. With this structure, the terminal section 18b of the first electrode member 16 can be securely held by the backup section 52, so a flexible printed circuit 50a can be securely connected to the terminals in the terminal section 18b. On the other hand, the terminal section 24 of the head suspension 20 can be securely held by the other backup section 52, so a flexible printed circuit 50b can be securely connected to the terminal section 24.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A piezoelectric actuator, comprising:
   a movable member to which a head suspension is fixed;
   a fixed member being fixed to a carriage arm;
   a plurality of piezoelectric elements being provided between said movable member and said fixed member, said piezoelectric elements being capable of adjusting a position of the head suspension by their deformation; and
   an electrode member being provided to a part of said fixed member on which said piezoelectric elements are provided, said electrode member having an electric conductive layer, which is electrically insulated from said fixed member and electrically connected to one of electrodes of each of said piezoelectric elements,
   wherein said movable member is adhered on said piezoelectric elements and electrically insulated from the other electrodes of said piezoelectric elements, and
   the electric conductive layer of said electrode member and the other electrode of each of said piezoelectric elements are electrically connected to cables, which are provided to the head suspension so as to actuate said piezoelectric elements.

2. The piezoelectric actuator according to claim 1, wherein the cables of the head suspension are connected to the electric conductive layer of said electrode member and the other electrodes of said piezoelectric elements are connected by wire bonding.

3. The piezoelectric actuator according to claim 1, wherein a terminal section, to which a flexible printed circuit is connected, is formed at an edge of the head suspension, and said terminal section includes terminals of the cables for actuating said piezoelectric elements.

4. The piezoelectric actuator according to one of claims 1, wherein surfaces of said piezoelectric elements, which are adhered to said movable member, are coated with insulating layers.

5. The piezoelectric actuator according to one of claims 1, wherein said piezoelectric elements and said movable member are adhered by an adhesive which includes insulating fillers.

6. The piezoelectric actuator according to one of claims 1, wherein said fixed member has backup sections, which are formed into L-shape by bending both side edges of a base section of said fixed member.

7. A piezoelectric actuator, comprising:
   a movable member to which a head suspension is fixed;
   a fixed member being fixed to a carriage arm; and
   a plurality of piezoelectric elements being provided between said movable member and said fixed member, said piezoelectric elements being capable of adjusting a position of the head suspension by their deformation;
   wherein said piezoelectric elements are fixed to said fixed member, and one of electrodes of each of said piezoelectric elements is electrically connected to said fixed member,
   said movable member is adhered on said piezoelectric elements and electrically insulated from the other electrodes of said piezoelectric elements, and
   the other electrode of each of said piezoelectric elements is electrically connected to a cable, which is provided to the head suspension so as to actuate said piezoelectric elements.

8. The piezoelectric actuator according to claim 7, wherein a terminal section, to which a flexible printed circuit is connected, is formed at an edge of the head suspension, and said terminal section includes terminals of the cable for actuating said piezoelectric elements.

9. The piezoelectric actuator according to one of claims 7, wherein surfaces of said piezoelectric elements, which are adhered to said movable member, are coated with insulating layers.

10. The piezoelectric actuator according to one of claims 7, wherein said piezoelectric elements and said movable member are adhered by an adhesive which includes insulating fillers.

11. The piezoelectric actuator according to one of claims 7, wherein said fixed member has backup sections, which are formed into L-shape by bending both side edges of a base section of said fixed member.

12. A piezoelectric actuator, comprising:
    a movable member to which a head suspension is fixed;
    a fixed member being fixed to a carriage arm;
    a plurality of piezoelectric elements being provided between said movable member and said fixed member, said piezoelectric elements being capable of adjusting a position of the head suspension by their deformation; and
    an electrode member being provided to a part of said fixed member on which said piezoelectric elements are provided, said electrode member having a pair of wiring patterns, which are electrically insulated from said fixed member and electrically connected to electrodes of each of said piezoelectric elements so as to actuate said piezoelectric elements, and being extended so as to connect a flexible printed circuit thereto;
    wherein said piezoelectric elements are fixed to said electrode member, and one of the wiring patterns is electrically connected to one of the electrodes of each of said piezoelectric elements,
    said movable member is adhered on said piezoelectric elements, and said movable member is electrically insulated from the other electrode of each of said piezoelectric elements, and
    the other wiring pattern is electrically connected to the other electrode of each of said piezoelectric elements.

13. The piezoelectric actuator according to claim 12, wherein terminals of the wiring patterns and a terminal section of the head suspension are located on the same side.

14. The piezoelectric actuator according to claim 12, wherein surfaces of said piezoelectric elements, which are adhered to said movable member, are coated with insulating layers.

15. The piezoelectric actuator according to one of claims 12,
wherein said piezoelectric elements and said movable member are adhered by an adhesive which includes insulating fillers.

16. The piezoelectric actuator according to one of claims 12,
wherein said fixed member has backup sections, which are formed into L-shape by bending both side edges of a base section of said fixed member.

17. A piezoelectric actuator, comprising:
a movable member to which a head suspension is fixed;
a fixed member being fixed to a carriage arm;
a plurality of piezoelectric elements being provided between said movable member and said fixed member, said piezoelectric elements being capable of adjusting a position of the head suspension by their deformation;
a first electrode member being provided between said fixed member and said piezoelectric elements; and
a second electrode member being provided between said movable member and said piezoelectric elements,
wherein said first electrode member includes a pair of wiring patterns, which are electrically connected to electrodes of each of said piezoelectric elements, and terminals, which are formed in a side edge of said fixed member and can be connected to a flexible printed circuit, and
said second electrode includes a terminal, which is electrically connected to one of the wiring patterns connected to one of the electrodes of each of said piezoelectric elements when said piezoelectric elements are sandwiched between said first electrode member and said second electrode member.

* * * * *

UNITED STATES PATENT AND TRADEMARK OFFICE
CERTIFICATE OF CORRECTION

PATENT NO.    : 6,741,012 B2  
DATED         : May 25, 2004  
INVENTOR(S)   : Koganezawa et al.

It is certified that error appears in the above-identified patent and that said Letters Patent is hereby corrected as shown below:

Title page,  
Item [57], ABSTRACT,  
Line 2, before "precisely," please delete "highly" therefor.  
Line 2, before "magnetic," please delete "a" therefor.  
Lines 3-4, between "actuator" and "movable," please delete "comprises:" and insert -- includes -- therefor.  
Line 5, after "fixed," please change the semicolon to a comma therefor.  
Line 5, after "arm," please change the semicolon to a comma therefor.  
Line 7, between "fixed member and" and "capable," please insert -- which are -- therefor.  
Line 8, after "deformation," please change the semicolon to a comma therefor.  
Line 9, please delete "one of electrodes" and insert -- an electrode -- therefor.  
Lines 11-12, between "electronically insulated from" and "of the piezoelectric," please delete "the other electrodes" and insert -- another electrode -- therefor.  
Line 12, between "elements." and "electric," please delete "The" and insert -- An -- therefor.

Column 11,  
Line 34, at beginning of paragraph, please insert -- wherein -- therefor.  
Lines 50, 55 and 58, please delete "one of claims" and insert -- claim -- in its place therefor.

Column 12,  
Line 2, after "deformation," please replace the semicolon with a comma therefor.  
Line 7, before "said movable," please insert -- wherein -- therefor.  
Line 11, before "the other," please insert -- wherein -- therefor.  
Line 22, please delete "one of the claims" and insert -- claim -- in its place therefor.  
Line 26, please delete "one of claims" and insert -- claim -- in its place therefor.  
Lines 31-32, please delete "one of claims" and insert -- claim -- in its place therefor.  
Line 53, after "thereto," please replace the semicolon with a comma therefor.  
Line 57, at the beginning paragraph, before "movable member," please insert -- wherein -- therefor.  
Line 61, at the beginning paragraph, before "the other," please insert -- wherein -- therefor.

Column 13,  
Lines 5 and 10, please delete "one of claims" and insert -- claim -- in its place therefor.

UNITED STATES PATENT AND TRADEMARK OFFICE
CERTIFICATE OF CORRECTION

PATENT NO. : 6,741,012 B2
DATED : May 25, 2004
INVENTOR(S) : Koganezawa et al.

It is certified that error appears in the above-identified patent and that said Letters Patent is hereby corrected as shown below:

Column 14,
Line 13, at the beginning paragraph, before "said second," please insert -- wherein -- therefor.

Signed and Sealed this

Seventh Day of December, 2004

JON W. DUDAS
*Director of the United States Patent and Trademark Office*